(12) United States Patent
Lee et al.

(10) Patent No.: US 8,846,421 B2
(45) Date of Patent: Sep. 30, 2014

(54) METHOD OF MANUFACTURING LEAD FRAME FOR LIGHT-EMITTING DEVICE PACKAGE AND LIGHT-EMITTING DEVICE PACKAGE

(75) Inventors: Jin-Woo Lee, Chanwon (KR); Jae-Hoon Jang, Chanwon (KR); Dong-Hoon Lee, Chanwon (KR); Jae-Ha Kim, Chanwon (KR)

(73) Assignee: MDS Co. Ltd., Changwon-si (KR)

( * ) Notice: Subject to any disclaimer, the term of this patent is extended or adjusted under 35 U.S.C. 154(b) by 0 days.

(21) Appl. No.: 13/416,202

(22) Filed: Mar. 9, 2012

(65) Prior Publication Data

US 2012/0228660 A1    Sep. 13, 2012

(30) Foreign Application Priority Data

Mar. 10, 2011 (KR) .................. 10-2011-0021429
Mar. 10, 2011 (KR) .................. 10-2011-0021430

(51) Int. Cl.
*H01L 21/00* (2006.01)
*H01L 33/62* (2010.01)
*H01L 33/60* (2010.01)

(52) U.S. Cl.
CPC .......... *H01L 33/62* (2013.01); *H01L 2933/0066* (2013.01); *H01L 33/60* (2013.01); *H01L 2224/48247* (2013.01); *H01L 2224/48257* (2013.01)
USPC 438/27; 257/98; 257/E33.056; 257/E33.072; 216/14; 427/457; 427/532

(58) Field of Classification Search
USPC ......... 257/79, 98, E33.058, E33.06, E33.067, 257/E33.071, E33.072, E33.074, E33.056, 257/E23.005; 438/22, 26, 27, 29; 216/14; 427/58, 457, 532
See application file for complete search history.

(56) References Cited

U.S. PATENT DOCUMENTS

| | | | |
|---|---|---|---|
| 5,841,496 A * | 11/1998 | Itoh et al. ................ | 349/113 |
| 2003/0036229 A1 * | 2/2003 | Nakata et al. ............. | 438/200 |
| 2003/0064593 A1 * | 4/2003 | Kumar et al. ............. | 438/689 |
| 2008/0142820 A1 * | 6/2008 | Edmond et al. ........... | 257/98 |
| 2009/0129115 A1 * | 5/2009 | Fine et al. ................ | 362/606 |
| 2009/0146170 A1 | 6/2009 | Zhong et al. | |
| 2009/0146280 A1 * | 6/2009 | Shimazaki et al. ........ | 257/676 |
| 2009/0267104 A1 | 10/2009 | Hsu et al. | |
| 2010/0190297 A1 * | 7/2010 | Lin et al. ................. | 438/118 |

(Continued)

FOREIGN PATENT DOCUMENTS

| | | | | |
|---|---|---|---|---|
| JP | 2009-117757 | * | 5/2009 | ............. H01L 33/00 |
| JP | 2009-117757 A | | 5/2009 | |
| KR | 10-2010-0039678 A | | 4/2010 | |

OTHER PUBLICATIONS

Machine translation, Hata, Japanese Pat. Pub. No. 2009-117757 (translated Oct. 31, 2013), JPO and Japio, all pages.*

(Continued)

*Primary Examiner* — Fernando L Toledo
*Assistant Examiner* — Victoria K Hall
(74) *Attorney, Agent, or Firm* — Sughrue Mion, PLLC

(57) ABSTRACT

A method of manufacturing a lead frame for a light-emitting device package and a light-emitting device package are provided. The method of manufacturing a lead frame for a light-emitting device package includes: preparing a base substrate for the lead frame; forming diffusion roughness on the base substrate; and forming a reflective plating layer on the diffusion roughness formed base substrate.

13 Claims, 23 Drawing Sheets

(56) References Cited

U.S. PATENT DOCUMENTS

2010/0190927 A1* 7/2010 Schwabe et al. ............. 525/54.1
2010/0213499 A1* 8/2010 Yamamoto ...................... 257/99
2011/0062474 A1* 3/2011 Chen et al. ...................... 257/98

OTHER PUBLICATIONS

Machine translation, Myoung, Korean Pat. Pub. No. 10-2010-0039678 (translated Oct. 31, 2013), KIPO, all pages.*

* cited by examiner

METHOD OF MANUFACTURING LEAD FRAME FOR LIGHT-EMITTING DEVICE PACKAGE AND LIGHT-EMITTING DEVICE PACKAGE

CROSS-REFERENCE TO RELATED PATENT APPLICATIONS

This application claims priority from Korean Patent Application Nos. 10-2011-0021429 and 10-2011-0021430, filed on Mar. 10, 2011, respectively, in the Korean Intellectual Property Office, the disclosures of which are incorporated herein in their entirety by reference.

BACKGROUND

1. Field

Methods and apparatuses consistent with exemplary embodiments relate to a lead frame for a light-emitting device package.

2. Description of the Related Art

A light-emitting device package includes a light-emitting device having a shape of a point light source, such as a light-emitting diode (LED), a laser diode (LD), or the like, and a lead frame that supports the light-emitting device and provides an electrical path.

Brightness that is a significant characteristic of the light-emitting device package increases as reflectivity (in units of GAM) of the lead frame and reflectivity of a pre-mold structure increase. A viewing angle of the light-emitting device package is affected by a shape, for example, a wall angle, a height, or the like of the pre-mold structure and a shape and characteristic of a lens for a light-emitting device that adjusts an angle of light.

A plating characteristic of the lead frame has been improved to enhance the performance of the light-emitting device package by increasing reflectivity of the lead frame. A surface layer of the lead frame is finally formed of a reflective surface that is a very smooth minor surface.

SUMMARY

One or more exemplary embodiments provide a method of manufacturing a lead frame for a light-emitting device package and a light-emitting device package, whereby surface processing is performed to have a wide viewing angle and a wide radiation width.

According to an aspect of an exemplary embodiment, there is provided a method of manufacturing a lead frame for a light-emitting device package, the method including: preparing a base substrate for the lead frame; forming diffusion roughness on the base substrate; and forming a reflective plating layer on the diffusion roughness formed base substrate.

The forming the diffusion roughness may be performed by applying at least one of an etching process, an oxidation process, mechanical stamping, and surface polishing onto the base substrate.

The etching process may include applying at least one of a stripper, a hydrogen peroxide-sulfuric acid-based soft etching solution, and an oxidizing agent onto the base substrate.

The forming the diffusion roughness may include applying at least one of mechanical stamping and a surface polishing process onto the base substrate.

The surface polishing process may include sand blasting.

The forming the diffusion roughness may include applying a surface roughness plating process onto the base substrate.

In the surface roughness plating process, a plating process may be performed by applying a high current-applying plating onto the base substrate by using a plating solution, containing at least one of nickel (Ni) and copper (Cu) having low concentration, as a plating material, to form a non-uniform plating surface on the base substrate.

In the surface roughness plating process, a plating process may be performed by using at least one of Ni and Cu as a plating material and applying a low plating current enough to form plating morphology in a spherical structure.

In the surface roughness plating process, a silver (Ag) strike layer may be formed by applying a high plating current that is sufficient for a plating surface to have diffusion roughness.

The forming the reflective plating layer may include: forming a non-brilliant plating layer on the diffusion roughness formed base substrate; and forming a high brilliant plating, in which more brightener is included than in the non-brilliant plating layer, layer on the non-brilliant plating layer.

At least one of the non-brilliant plating layer and the high brilliant plating layer may include at least one of silver (Ag) and aluminum (Al).

At least one of the forming the non-brilliant plating layer and the forming the high brilliant plating layer may be performed by applying a high current density to a plating layer so that an acicular structure is formed on the plating layer.

The forming the reflective plating layer may include forming a reflective plating layer having spherical morphology on the diffusion roughness formed base substrate.

The forming the reflective plating layer may include performing a plating process by applying a low plating current density enough to form plating morphology in a spherical structure.

The forming the reflective plating layer may include performing plating with a low current density of 0.3 to 2.0 ASD (A/dm$^2$).

The forming the reflective plating layer may include forming an Ag plating layer by applying a brightener.

The method may further include forming a metal coating layer including at least one of a metal seed layer and an under layer before forming of the reflective plating layer.

According to another aspect of the present invention, there is provided a light-emitting device package including: a light-emitting device; and a lead frame on which the light-emitting device is mounted, wherein the lead frame includes: a high brilliant plating layer which forms an outermost layer of the lead frame; and a non-brilliant plating layer that forms an under layer of the high brilliant plating layer.

The high brilliant plating layer may have a relatively fine grain size, and the non-brilliant plating layer may have a relatively rough grain size.

According to another aspect of the present invention, there is provided a light-emitting device package including: a light-emitting device; and a lead frame on which the light-emitting device is mounted, wherein the lead frame includes a reflective plating layer which forms an outermost layer of the lead frame and has plating morphology in at least one of a spherical structure and an acicular structure.

The reflective plating layer may include an Ag plating layer including ingredients of a brightener.

BRIEF DESCRIPTION OF THE DRAWINGS

The above and other aspects will become more apparent by describing in detail exemplary embodiments thereof with reference to the attached drawings, in which.

DETAILED DESCRIPTION

The exemplary embodiments will now be described more fully with reference to the accompanying drawings.

Figure 1:
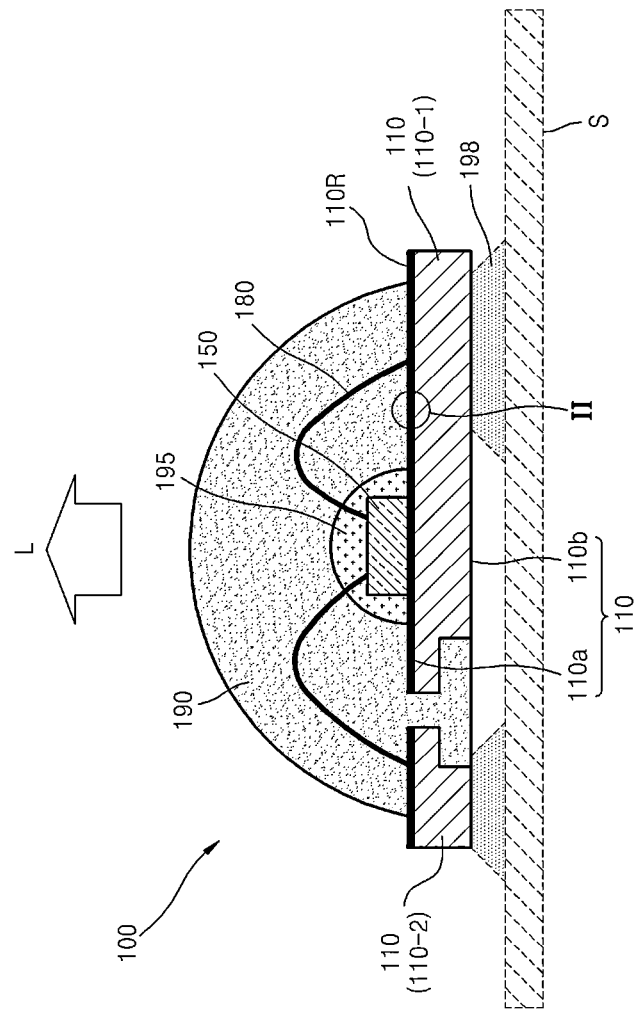
FIG. 1 is a cross-sectional view of a structure of a light-emitting device package according to an exemplary embodiment.

FIG. 1 is a cross-sectional view of a structure of a light-emitting device package 100 according to an exemplary embodiment. Referring to FIG. 1, the light-emitting device package 100 includes a light-emitting device 150, a lead frame 110 on which the light-emitting device 150 is mounted, a fluorescent substance 195 deposited on the lead frame 110 to encapsulate the light-emitting device 150, and a silicon lens 190 disposed on the lead frame 110 on which the light-emitting device 150 is mounted.

A reflective surface 110R is formed on a top surface of the lead frame 110 that supports the light-emitting device 150. Light rays reflected in directions other than an effective display direction L, for example, an upward direction, emitted from the light-emitting device 150 on an emission path of the light-emitting device 150, are reflected from the reflective surface 110R so that paths of the light rays reflected from the reflective surface 110R are changed into the effective display direction L.

The light-emitting device 150 may be implemented as a light-emitting diode (LED), a laser diode (LD), or the like. Some light rays of light emitted from the light-emitting device 150 are directly radiated in the effective display direction L, for example, in the upward direction, and paths of some light rays of the light are changed into the effective display direction L by means of the reflective surface 110R on the lead frame 110 so that a substantial portion of the light may be radiated in the upward direction. The light-emitting device 150 may emit light by using a driving power supplied to the light-emitting device 150 via the lead frame 110. To this end, the light-emitting device 150 may be electrically connected to the lead frame 110 via a conductive wire 180 formed of gold (Au), or copper (Cu).

The lead frame 110 as a main element of the light-emitting device package 100 supports the light-emitting device 150, and electrically connects the light-emitting device 150 to an external circuit. For example, the lead frame 110 may be electrically connected to a driving circuit substrate S disposed outside the light-emitting device package 100, and may form a power path between the driving circuit substrate S and the light-emitting device 150.

The lead frame 110 may include first and second lead areas 110-1 and 110-2 that are spaced apart from each other by a predetermined distance. The first and second lead areas 110-1 and 110-2 may be connected to an anode terminal (not shown) and a cathode terminal (not shown) of the light-emitting device 150, respectively. The first and second lead areas 110-1 and 110-2 may be asymmetrical with each other, and the light-emitting device 150 may be mounted on the first lead area 110-1.

Each of the first and second lead areas 110-1 and 110-2 may include an internal lead portion 110a disposed inside the light-emitting device package 100 and an external lead portion 110b exposed outside the light-emitting device package 100. The internal lead portion 110a may be electrically connected to the light-emitting device 150 via the conductive wire 180. For example, the conductive wire 180 formed of Au or Cu may be suspended between the internal lead portion 110a and an electrode pad (not shown) of the light-emitting device 150, and may extend from the internal lead portion 110a. The external lead portion 110b may be exposed outside the light-emitting device package 100, and may form a contact point with the driving circuit substrate S disposed outside the light-emitting device package 100. For example, the external lead portion 110b and the driving circuit substrate S may be electrically connected to each other via a connection member 198 formed of a soldering material.

In the present embodiment, the light-emitting device 150 and the lead frame 110 are electrically connected to each other by using the conductive wire 180 having one end connected to the electrode pad (not shown) of the light-emitting device 150 and the other end connected to the lead frame 110. However, in another embodiment, the light-emitting device 150 and the lead frame 110 may be electrically connected to each other by using a conductive bump (not shown).

The silicon lens 190 is disposed on the lead frame 110 on which the light-emitting device 150 is mounted, in order to physically and electrically protect the light-emitting device 150 from an external environment. More specifically, the silicon lens 190 may be disposed in order to insulate the light-emitting device 150 and a bonding portion from the external environment, and in order to prevent foreign substances from being introduced into the light-emitting device 150 and the bonding portion. The bonding portion may be a connection portion between the light-emitting device 150 and the conductive wire 180, or a connection portion between the conductive wire 180 and the lead frame 110. As illustrated in FIG. 1, the silicon lens 190 may cover the light-emitting device 150 and the conductive wire 180 to protect them.

The light-emitting device 150 is covered by the silicon lens 190, and light emitted from the light-emitting device 150 is emitted through the silicon lens 190. The silicon lens 190 may be formed of a light transparent resin material on the fluorescent substance 195 for encapsulating the light-emitting device 150.

For example, the silicon lens 190 may be formed of a silicon resin, an epoxy resin, or the like. However, the inventive concept is not limited thereto, and the silicon lens 190 may be formed of a material having high light transmittance and a refractive index suitable for diffusion of light emitted from the light-emitting device 150 and may act as a lens.

The silicon lens 190 may be used in order for light emitted from the light-emitting device 150 to diffuse with a wide radiation width and may have various shapes. For example, the silicon lens 190 may have a hemispheric shape or a shape close to the hemispheric shape, as illustrated in FIG. 1. For example, due to refraction of the silicon lens 190, the emitted light may be diffused with a wide radiation width.

Figure 2:
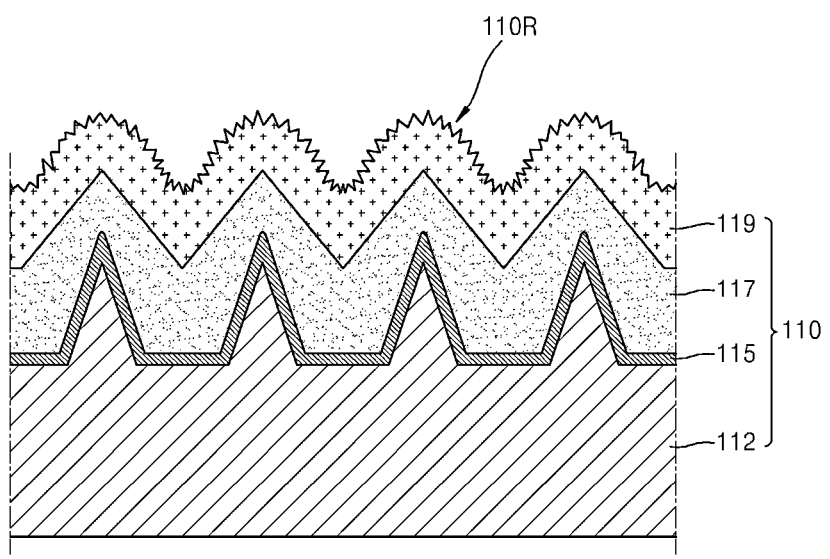
FIG. 2 is an enlarged view of a portion II of FIG. 1, according to an exemplary embodiment.

FIG. 2 is an enlarged view of a portion II of FIG. 1. For example, the lead frame 110 may have a stack structure in which a base substrate 112, a metal coating layer 115 formed on the base substrate 112 to improve a bonding force between layers formed of different materials, and reflective plating layers 117 and 119. The reflective plating layers 117 and 119 may be a non-brilliant plating layer and a high brilliant plating layer, respectively which are formed on the metal coating layer 115 sequentially.

A reflective surface 110R, on which light emitted from the light-emitting device 150 is incident, is formed on a top surface of the lead frame 110, and has predetermined surface roughness or diffusion roughness for light diffusion. The reflective surface 110R having the predetermined surface roughness promotes diffuse reflection or scattering of the light emitted from the light-emitting device 150 so that the light may be diffused with a wide radiation width. Hereinafter, the surface roughness and the diffusion roughness are interchangeably referred to in describing various exemplary embodiments.

The reflective surface 110R of the lead frame 110 may be implemented as the reflective plating layers 117 and 119 that form an outermost circumference of the lead frame 110. The reflective plating layers 117 and 119 may be formed of at least one material, having high reflectivity in a visible light band, which includes aluminum (Al), silver (Ag), gold (Au), and the like. In addition, the reflective plating layers 117 and 119 may be also formed of an alloy material including functional ingredients other than the high-reflectivity material. The reflective surface 110R of the lead frame 110 may be also formed of a high brilliant metal.

The light emitted from the light-emitting device 150 in the effective display direction L, for example, in the upward direction, may be incident directly onto a display surface. Some light rays of the light emitted from the light-emitting device 150 in directions other than the effective display direction L pass through the reflective surface 110R of the lead frame 110 formed on a bottom surface of the light-emitting device 150, and paths of these light rays are changed into the effective display direction L.

For example, a proceeding direction of light rays emitted from the light-emitting device 150 in a direction towards the bottom surface of the light-emitting device 150 is changed into the upward direction by means of the reflective surface 110R of the lead frame 110. The paths of the light rays emitted from the light-emitting device 150 in directions other than the effective display direction L are changed into the effective display direction L by using the reflective surface 110R of the lead frame 110 that supports the light-emitting device 150 so that light extraction efficiency of the light-emitting device package 100 may be improved.

The light rays emitted from the light-emitting device 150 are reflected from the reflective surface 110R of the lead frame 110 towards the effective display direction L, for example, towards the upward direction. That is, the paths of the light rays emitted from the light-emitting device 150 are changed into the effective display direction L by means of the reflective surface 110R having predetermined surface roughness. In this case, the light rays incident on the reflective surface 110R are reflected at various viewing angles that vary according to incidence positions.

The surface roughness may have shaped patterns with predetermined periods, or randomly-formed, unshaped patterns. The reflective surface 110R having the surface roughness allows paths of the light rays from the light-emitting device 150 incident on the reflective surface 110R in a downward direction to be changed into the effective display direction L, for example, the upward direction, and simultaneously allows the incident light rays to be widely diffused. That is, the incident light rays having the same incidence angle are radiated at various viewing angles while passing through the reflective surface 110R. The reflective surface 110R having the surface roughness allows the incident light rays to be diffused at a wide radiation width on a wide display surface so that uniform brightness of the light-emitting device package 100 may be obtained.

The light-emitting device package 100 may be used for a display, for example, an illumination device for a flat panel display. For example, when a surface light source for a display, for example, a backlight for a display, is configured by using a point light source, such as a light-emitting device package, a plurality of light-emitting device packages 100 are disposed in parallel so that uniform light distribution over the display surface may be obtained and a low-brightness area, a dark point, or a dead area may not be formed on a part of the display surface.

According to an exemplary embodiment, the light-emitting device package 100 including a plurality of light-emitting devices 150 may be mounted on the driving circuit substrate S. The plurality of light-emitting devices 150 may emit light by using a driving power supplied to each of the light-emitting devices 150 via the driving circuit substrate S. According to another exemplary embodiment, a plurality of the light emitting device packages 100, each of which includes one or more light emitting devices 150, may be mounted on the driving circuit substrate S.

The light rays are diffused with a wide radiation width by the reflective surface 110R having the surface roughness so that uniform brightness over a wide area of the display surface may be provided. When the light-emitting device package 100 in which light rays are diffused in a relatively wide range is used, a surface light source having uniform brightness distribution may be obtained using a relatively small number of light-emitting device packages 100, and thus, manufacturing costs of the surface light source may be reduced. In this regard, by using the reflective surface 100R having the surface roughness, the surface light source having uniform brightness while using a relatively small number of light-emitting device packages 100 may be provided.

Figure 3A:
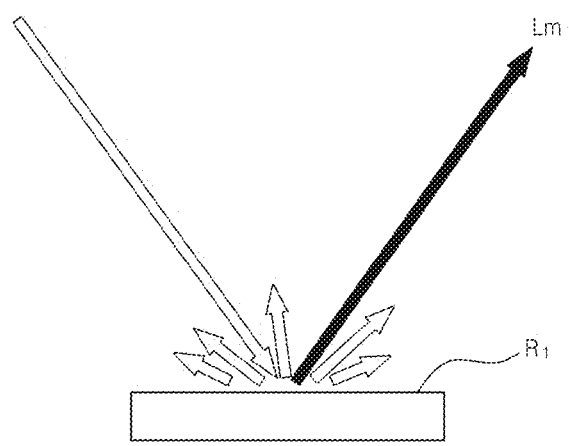
FIGS. 3A and 3B illustrate shapes of reflection formed on a smooth minor reflective surface, according to a related art.
Figure 3B:
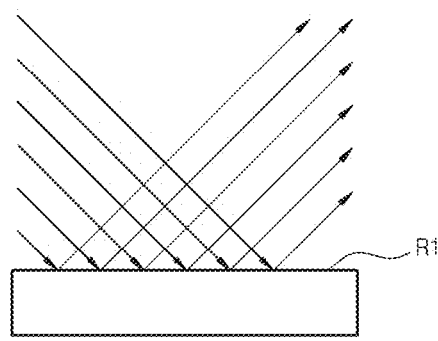

As illustrated in FIG. 3A, light incident on a relatively smooth minor reflective surface R1 shows a superior light intensity Lm at a main viewing angle and a relatively minor light intensity at viewing angles other than the main viewing angle. That is, this corresponds to a specular reflection or similar reflection shape. The reflected light has Gaussian distribution in which the light intensity of the reflected light is concentrated on the main viewing angle and shows distinct directivity, and is rapidly decreased at the viewing angles other than the main viewing angle. As illustrated in FIG. 3B, in specular reflection, light rays that proceed in parallel have predetermined incidence angles with respect to the mirror reflective surface R1, and thus, paths of the light rays are changed to have predetermined viewing angles.

Figure 4A:
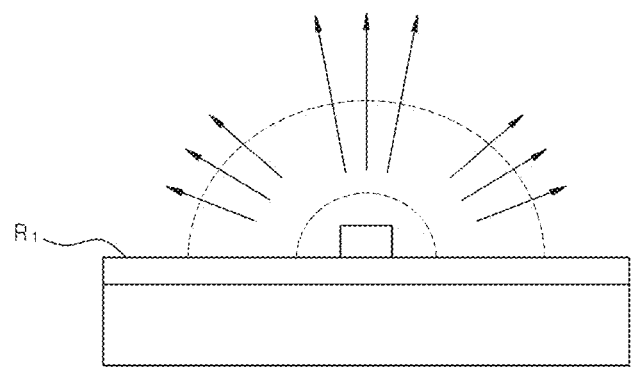
FIGS. 4A through 4C illustrate light-emitting states on a minor reflective surface, according to a related art.
Figure 4B:
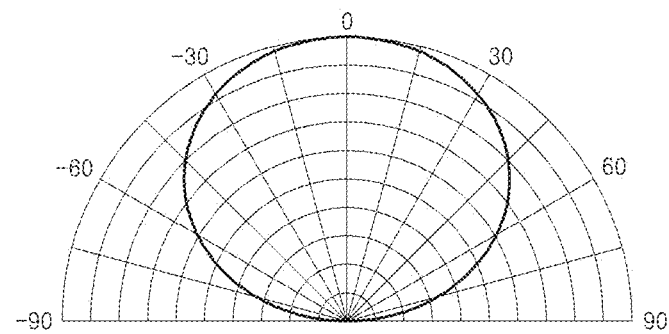
Figure 4C:
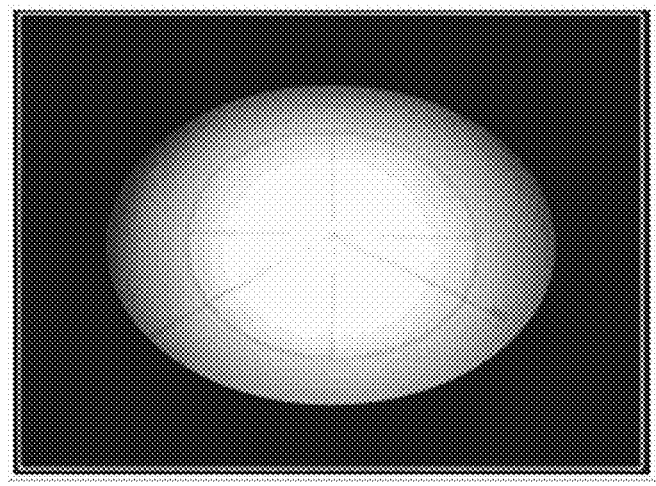

FIGS. 4A through 4C illustrate light-emitting states of a light-emitting device package having a relatively smooth minor reflective surface R1 on a lead frame, according to an exemplary embodiment. In detail, FIG. 4A is a perspective view of a light-emitting state, and FIG. 4B is a perspective view of distribution of light intensity in a radial direction according to viewing angles, and FIG. 4C is a photo showing an actual light-emitting state of the light-emitting device package on a display surface. Referring to FIGS. 4A through 4C, the light-emitting device package having the smooth mirror reflective surface R1 has light intensity distribution in which light is concentrated in a relatively upward direction as a main viewing angle and is relatively greatly decreased at viewing angles other than the main viewing angle. As shown in FIG. 4C, a central area of the display surface shows concentrative high brightness, and a low-brightness area is formed in peripheral areas other than the central area of the display surface.

Figure 5A:
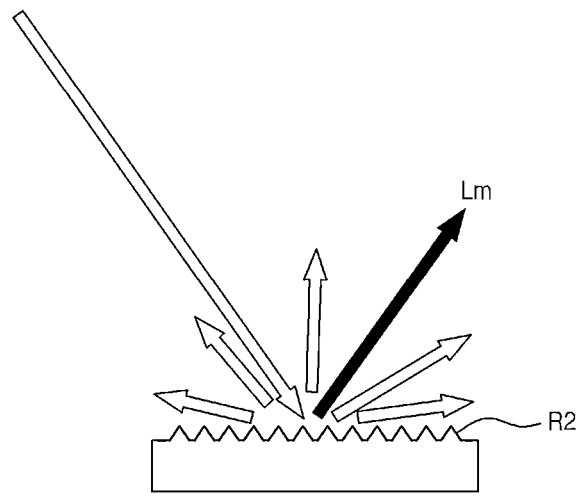
FIGS. 5A and 5B illustrate shapes of reflection formed on a reflective surface having surface roughness, according to exemplary embodiments.
Figure 5B:
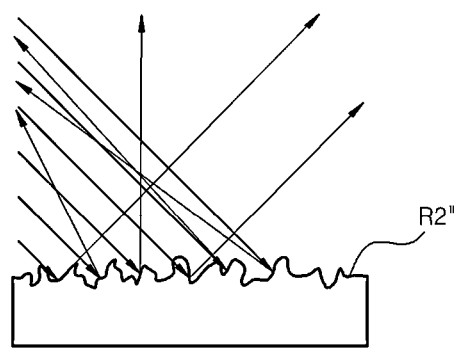

FIGS. 5A and 5B illustrate shapes of reflection formed on a reflective surface having surface roughness, according to exemplary embodiments.

As illustrated in FIG. 5A, light incident on a relatively rough surface, i.e., a reflective surface R2 having predetermined surface roughness shows a superior light intensity at a main viewing angle but shows a light intensity that is widely distributed at viewing angles other than the main viewing angle, and even though a light intensity is high at the main viewing angle, directivity of the light is significantly dull. This corresponds to a diffusion reflection shape. That is, distribution of viewing angles has a wide spectrum centering on the main viewing angle, and the light is diffused in a wide viewing angle range, and a radiation width is increased. As illustrated in FIG. 5B, in diffusion reflection, incidence angles vary according to incidence positions due to surface roughness of a reflective surface R2″, and thus, a light path is converted to have various viewing angles.

Figure 6A:
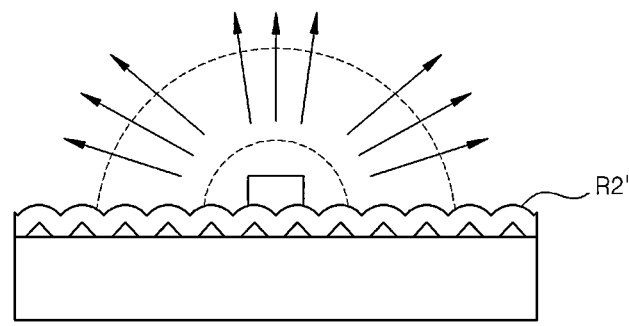
FIGS. 6A through 6C illustrate light-emitting states on a reflective surface having surface roughness, according to exemplary embodiments.
Figure 6B:
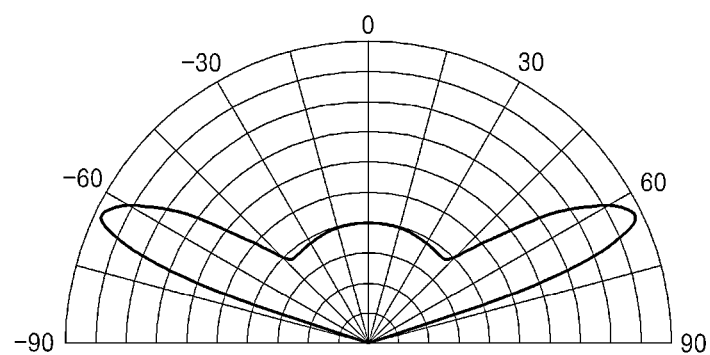
Figure 6C:
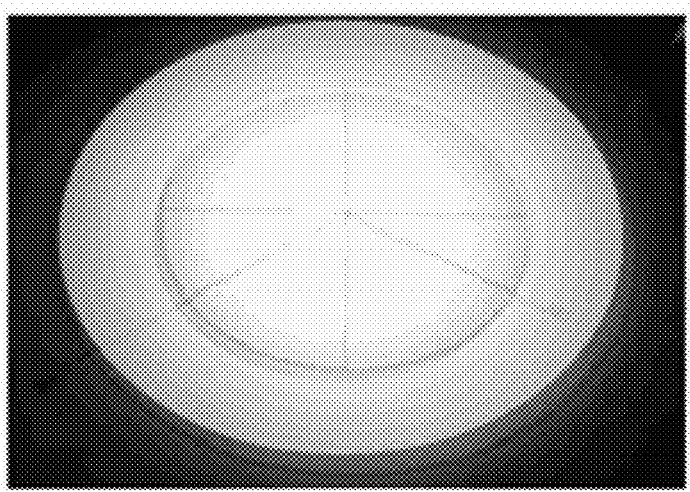

FIGS. 6A through 6C illustrate a light-emitting state of a light-emitting device package including a reflective surface R2′ having diffusion roughness on a lead frame, according to an exemplary embodiment. In detail, FIG. 6A is a perspective view of the light-emitting state, and FIG. 6B is a perspective view of distribution of light intensity in a radial direction according to viewing angles, and FIG. 6C is a photo showing an actual light-emitting state of the light-emitting device package on a display surface. Referring to FIGS. 6A through 6C, the light-emitting device package having the reflective surface R2′ having the diffusion roughness has light intensity distribution in which light is diffused with a relatively wide radiation width and light intensities are relatively uniform at viewing angles other than the upward direction. As shown in FIG. 6C, brightness is uniformly distributed in a central area of the display surface and its peripheral areas, and a relatively wide high-brightness area is formed.

Compared to the mirror reflective surface R1 illustrated in FIG. 3A, light intensities are relatively uniform at various viewing angles. This is because, in the reflective surfaces R2 and R2′ each having surface roughness, light is emitted at different viewing angles that vary according to incidence positions, and thus, light intensities are relatively uniform and light is diffused with a wide radiation width. That is, light intensity of Lambertian distribution in which a relatively superior light intensity is shown at a main viewing angle but light intensities are also somewhat uniform at viewing angles other than the main viewing angle, is shown.

As light is diffused with a wide radiation width through the reflective surfaces R2 and R2′ having the surface roughness, a surface light source in which light is widely diffused over a wide area of the display surface and which provides uniform brightness and has relatively uniform brightness distribution, may be provided. In this regard, a surface light source with uniform brightness distribution may be obtained using a relatively small number of light-emitting device packages having light beams having relatively wide spot sizes so that manufacturing costs of the surface light source may be reduced.

However, by using the relatively smooth minor reflective surface R1, the viewing angle is limited to a relatively narrow range and is concentrated on a narrow spectrum so that brightness is non-uniform. Thus, a relatively large number of light-emitting device packages needs to be used in order to provide a surface light source having uniform brightness distribution, which directly causes an increase in manufacturing costs.

On the reflective surfaces R2 and R2′ having the surface roughness, a light proceeding path is changed according to the surface roughness, or the light proceeding path is changed to have various viewing angles that vary according to incidence positions. In this regard, as illustrated in FIGS. 5A and 6A, the reflective surfaces R2 and R2′ having the surface roughness have different surface states according to incidence positions. Thus, incidence angles vary according to incident positions, and the spectrum of a viewing angle may be widely increased. Distribution of light intensities in a wide range means that a relatively small number of light-emitting device packages are suitable to obtain a surface light source having uniform light distribution and the number of light-emitting device packages required for providing the surface light source may be reduced.

Figure 7:
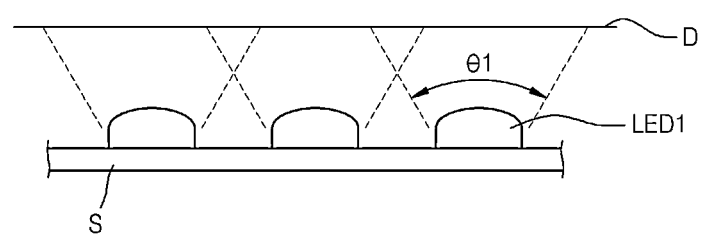
FIG. 7 is a perspective view of a shape of a surface light source configured by using light-emitting device packages according to an exemplary embodiment.
Figure 8:
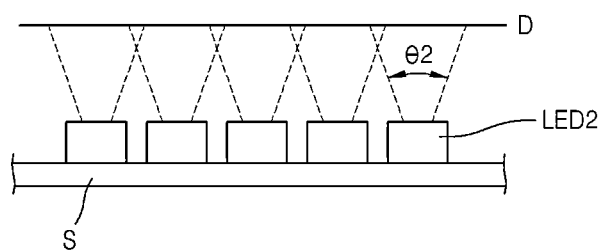
FIG. 8 is a perspective view of a shape of a surface light source configured by using light-emitting device packages having a mirror reflective surface according to a related art.

FIGS. 7 and 8 are perspective views of shapes of surface light sources configured by using light-emitting device packages LED1 and LED2. In detail, FIG. 7 illustrates a light source configured by using light-emitting device packages LED1, according to an exemplary embodiment, and FIG. 8 illustrates a light source configured by using light-emitting device packages LED2, according to a related art.

When a surface light source for a display is configured as a point light source by using light-emitting device packages LED1 and LED2, a plurality of light-emitting device packages LED1 and LED2 are disposed in parallel so that light emitted from the light-emitting device 150 may reach all areas of the display surface D and a low-brightness area in which the emitted light does not reach the display surface D, a dark point, or a dead area may be removed.

Referring to FIGS. 7 and 8, the plurality of light-emitting device packages LED1 and LED2 may be disposed in a matrix form, and thus, may be mounted on the driving circuit substrate S, and may emit light by using driving power supplied to the light-emitting device packages LED1 and LED2 via the driving circuit substrate S.

As illustrated in FIG. 7, sufficient brightness is obtained from light directly emitted from each light-emitting device package LED1 in a direct upward area of each light-emitting device package LED1. Sufficient brightness may be obtained in areas between adjacent light-emitting device packages LED1 when lights diffused with a wide radiation angle θ1 via a reflective surface having surface roughness are mixed. For example, paths of light rays emitted from each light-emitting device package LED1 in a direction other than an effective display direction are changed into the effective display direction via the reflective surface 110R of the lead frame 110, as described above with reference to FIG. 1. In this case, light is diffused with the wide radiation angle θ1 due to the surface roughness of the reflective surface 110R of the lead frame 110 so that a predetermined display area may be illuminated with uniform brightness by using a relatively small number of light-emitting device packages LED1.

As illustrated in FIG. 8, when the light-emitting device packages LED2 with a relatively narrow radiation angle θ2 are used, a large number of light-emitting device packages LED2 is required to illuminate the same display area with uniform brightness. This is because a radiation angle θ2 of each light-emitting device package LED2 is narrow so that a large number of light-emitting device packages LED2 is densely disposed. In the case where light does not reach areas between adjacent light-emitting device packages LED2, a dark low-brightness area, or a dead area may be formed.

Since, in the light source illustrated in FIG. 7, light emitted from each light-emitting device package LED1 is spread and diffused with a wide radiation angle θ1, uniform brightness distribution over the entire display surface D may be obtained while a relatively small number of light-emitting device packages LED1 is used.

Hereinafter, a method of manufacturing a lead frame for a light-emitting device package according to an exemplary embodiment will be described with reference to FIGS. 9A through 9F.

Figure 9A:
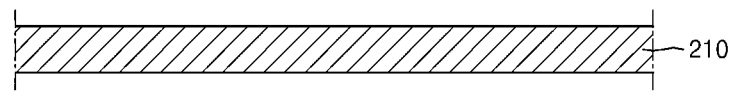
FIGS. 9A through 9F are cross-sectional views illustrating a method of manufacturing a lead frame for a light-emitting device package, according to an embodiment.

First, as illustrated in FIG. 9A, a base substrate 210 for a lead frame is prepared. The base substrate 210 may be formed of a general lead frame material, such as a Cu thin plate, a Cu alloy thin plate, an alloy thin plate having a main ingredient as iron-nickel (Ni), or the like.

Figure 9B:
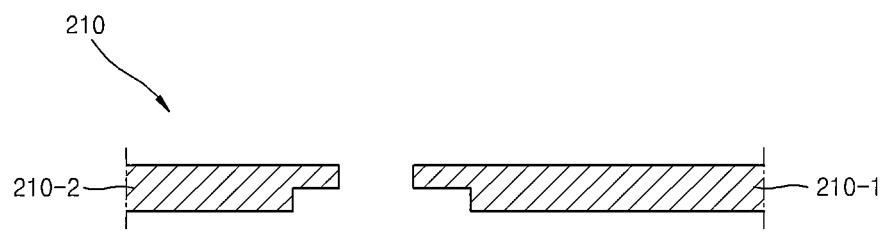

Next, as illustrated in FIG. 9B, a patterning process of forming lead frame patterns on the base substrate 210 is performed. In the patterning process, lead frame patterns having a first lead area 210-1 and a second lead area 210-2 with different polarities may be formed by removing a portion of the base substrate 210, and chemical etching, mechanical stamping, punching formation, or the like may be used in performing the patterning process. For example, the first and second lead areas 210-1 and 210-2 may be asymmetrical with each other, and one of the first and second lead areas 210-1 and 210-2 may be formed larger, and the light-emitting device 150 may be mounted on the lead area 210-1 that is formed larger.

Next, a pre-plating process is performed to remove an oxidation layer formed on the surface of the base substrate 210 by surface processing the base substrate 210, by which the base substrate 210 is activated. This pre-plating process may be performed through a series of unit processes, for example, electro degreasing, first acid dipping, chemical polishing, second acid dipping, neutralization, and the like. According to an exemplary embodiment, the pre-plating process may be performed before the patterning process.

Figure 9C:
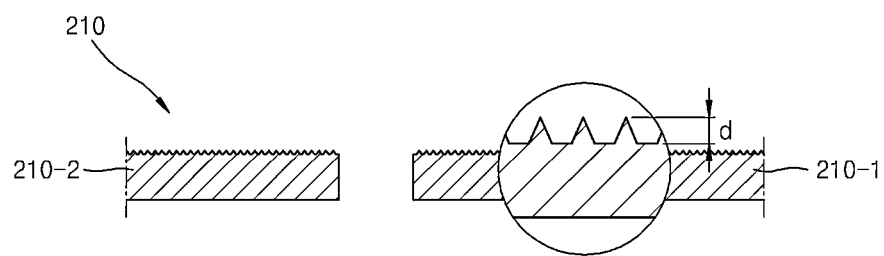

Next, as illustrated in FIG. 9C, a diffusion roughening process in which a surface of the base substrate 210 for a light diffusion is diffusion-roughened, is performed. For example, in the diffusion roughening process, a predetermined surface roughness sufficient to maintain a shape of patterns or a structure of the lead frame is formed. Here, diffusion roughness may refer to surface roughness sufficient to promote light diffusion without changing the patterns or structure of the lead frame. For example, the surface roughness in the diffusion roughening process may refer to an etching depth d of about 1.0 to 5.0 μm.

More specifically, the diffusion roughening process may be performed by using a chemical process and/or a physical process. The chemical process may include a chemical etching process, for example, micro etching, soft etching and/or flash etching to form a thin etching depth and/or an oxidation process, for example, black oxidation or brown oxidation. The physical process may include a polishing process such as mechanical stamping, sand blasting, or the like.

Figure 10:
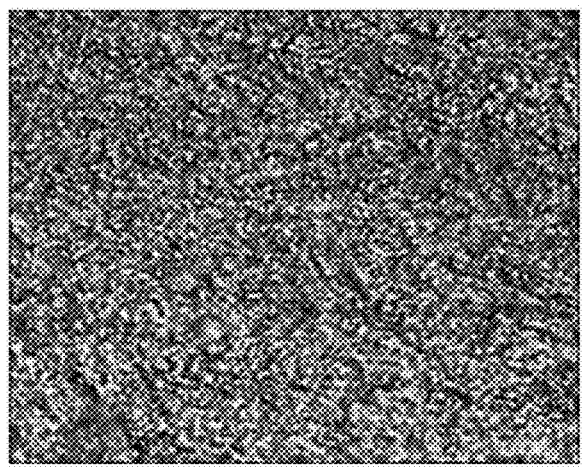
FIG. 10 is a photo showing a state of a diffusion-roughened surface, according to an exemplary embodiment.

In the chemical etching process, a diffusion roughening solution, such as a hydrogen peroxide-sulfuric acid-based soft etching solution, a stripper, an oxidizing agent, or a combination thereof, is applied to the base substrate 210. More specifically, in the diffusion roughening process, a copper stripper is applied to the base substrate 210 so that a reaction proceeds for about 10 to 60 seconds, and then, an oxidant type of roughness processing agent is applied to the base substrate 210 so that a reaction proceeds for about 5 to 120 seconds. FIG. 10 is a photo showing the state of a diffusion-roughened surface.

As described above, the polishing process, such as mechanical stamping, sand blasting, or the like, may be used in the diffusion roughening process. In this case, the diffusion roughening process may be performed prior to the patterning process on the base substrate 210, and then, the patterning process may be performed on the diffusion-roughened base substrate 210.

Figure 11A:
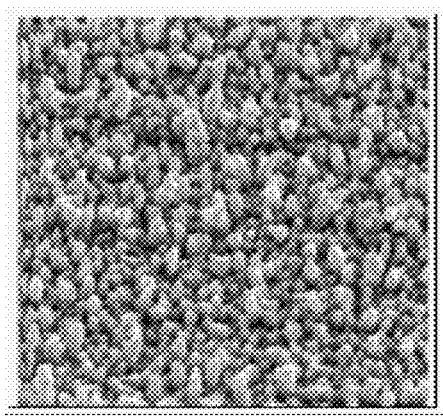
FIG. 11A is a photo showing a state of a surface on which Cu-roughening as a surface roughness plating process is performed, according to an exemplary embodiment.
Figure 11B:
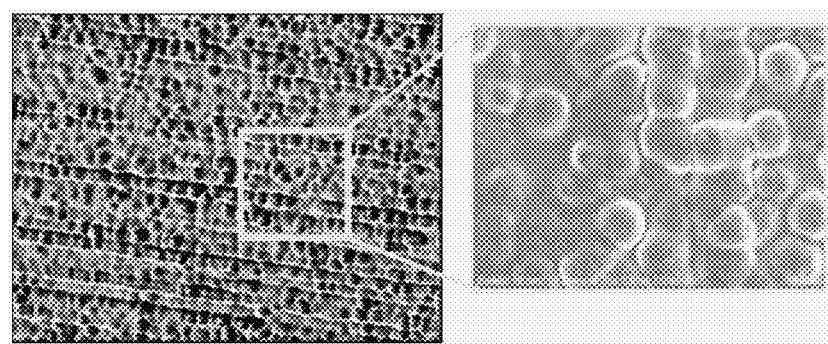
FIG. 11B is a photo showing a state where surface roughness is maintained even after silver (Ag) plating is performed on the surface of FIG. 11A, according to an exemplary embodiment.

Various surface roughness plating processes, such as Ni-roughening or Cu-roughening, as well as the surface processing process described above may be used in the diffusion roughening process. For example, when Ni or Cu is plated on the base substrate 210, i.e., when high current-applying plating is performed in a plating solution containing Ni or Cu having low concentration as a plating material, a Ni plating layer or a Cu plating layer having surface roughness is formed on the base substrate 210. For example, since a low-concentration plating material is used, a plating layer is not uniformly dispersed onto the base substrate 210, and is not densely formed but a plating layer having a rough surface on which a plating material is deposited on several areas of the base substrate 210 in a concentrative manner, may be formed. In this case, in the surface roughness plating process, when the Ni or Cu plating layer is formed to a thickness of a thin layer (less than 5 μm), the Ni or Cu plating layer may be formed after the above-mentioned pre-plating process is performed. FIG. 11A is a photo showing a state of a surface on which Cu-roughening as a surface roughness plating process is performed, and FIG. 11B is a photo showing a state where surface roughness is maintained even after Ag plating is performed on the surface of FIG. 11A.

Figure 12:
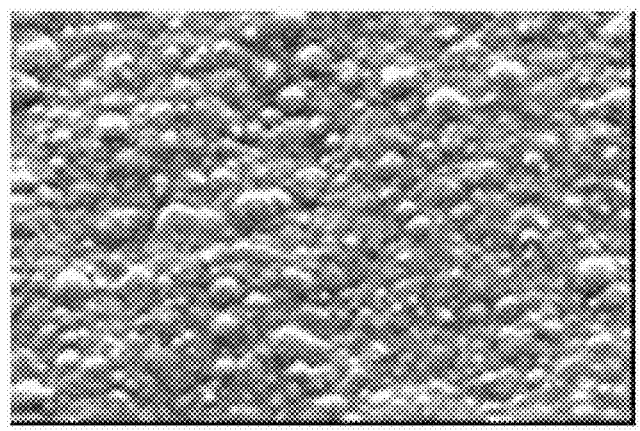
FIG. 12 is a photo showing a state of a surface of a nickel plating layer as another type of a surface roughness plating process, according to an exemplary embodiment.

As another type of a surface roughness plating process, a Ni plating layer or a Cu plating layer may be formed with a low current (less than 1.0 to 2.0 ASD) to form Ni plating morphology or Cu plating morphology in a spherical structure. FIG. 12 is a photo showing the state of a surface having diffusion roughness by using this type of a surface roughness plating process (Ni plating layer).

Figure 13:
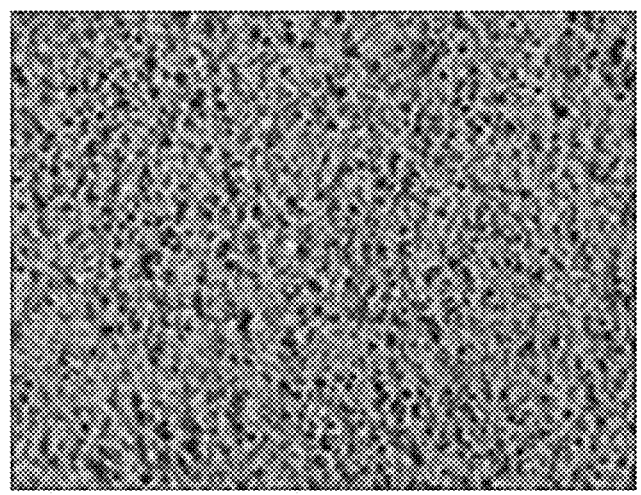
FIG. 13 is a photo showing a state of a surface of an Ag strike plating layer as another type of a surface roughness plating process, according to an exemplary embodiment.

As still another type of a surface roughness plating process, diffusion roughness may be formed on surface morphology by forming an Ag strike plating layer with a high current (3 to 5 ASD). FIG. 13 is a photo showing a state of a surface having diffusion roughness by using this type of a surface roughness plating process. Forming the Ag strike plating layer may be considered as the above-mentioned pre-plating process to be performed prior to forming a reflective plating layer that will be described later, or as a sub-process of forming the reflective plating layer. Since the Ag strike plating layer serves to improve a bonding force between layers, an additional process of forming a seed layer in order to improve a bonding force between layers may be omitted.

Figure 9D:
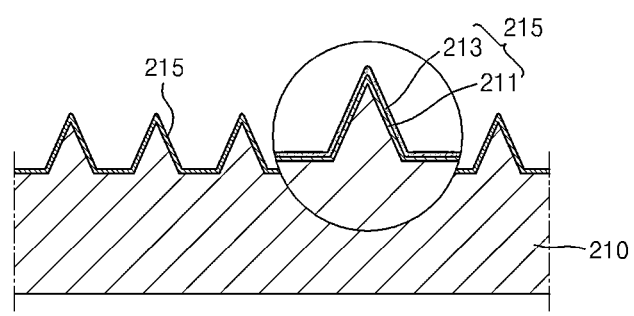

Next, as illustrated in FIG. 9D, a metal coating layer 215 may be formed on the base substrate 210. The metal coating layer 215 may include a metal seed layer 211 and an under layer 213, for example. The metal seed layer 211 serves to improve a bonding force between the metal seed layer 211 and the base substrate 210 and to improve a plating quality. The metal seed layer 211 may be formed of a metal material having a good adhesion force and an excellent bonding force between layers with respect to the base substrate 210. Although a candidate material group may be considered according to a material forming the base substrate 210, the metal seed layer 211 may be formed as a Cu strike layer, for example.

The under layer 213 may be formed on the metal seed layer 211. The under layer 213 formed before the reflective plating layer is formed may serve as a diffusion prevention layer to improve bonding characteristics of a conductive wire as a medium for an electrical connection between the under layer 213 and the light-emitting device 150 and to prevent migration of metal ions.

The metal seed layer 211 and the under layer 213 may be used in improving a bonding force between metal layers formed of different materials and stacked with respect to each other, and may serve to prevent metal ingredients of the base substrate 210 from being diffused onto the surface of the lead frame, to protect the reflective plating layer and to prevent formation of harmful ingredients.

The metal coating layer 215 is not limited to the metal seed layer 211 and the under layer 213, and may have various shapes in which a single metal layer formed of a same material or metal layers formed of different materials are stacked in two or more multi-layers, as occasion demands. One of the metal seed layer 211 and the under layer 213 may be omitted. For example, the metal seed layer 211 may be omitted according to plating conditions and plating characteristics.

Figure 9E:
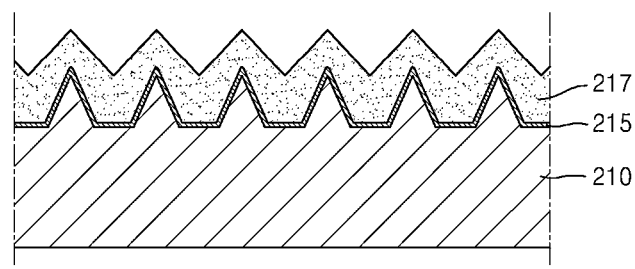
Figure 9F:
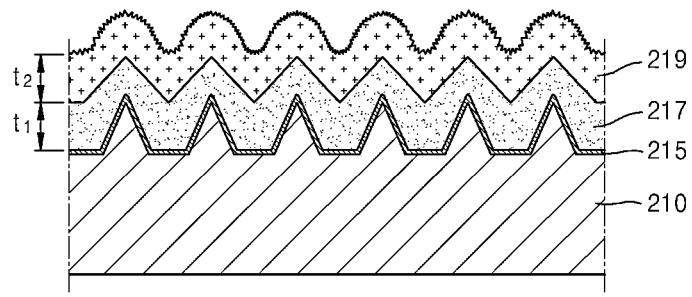

Next, as illustrated in FIGS. 9E and 9F, reflective plating layers 217 and 219 are formed on the base substrate 210. However, although not shown, an Ag strike layer may be formed in order to improve a bonding force between layers before forming the reflective plating layers 217 and 219.

The reflective plating layers 217 and 219 serve to improve light extraction efficiency of the light-emitting device 150 by reflecting light emitted from the light-emitting device 150 with high reflectivity (brilliance). The reflective plating layers 217 and 219 may be formed of at least one material, having high reflectivity in a visible light band which includes Al, Ag, Au, and the like. In addition, the reflective plating layers 217 and 219 may be also formed of an alloy material including functional ingredients other than the high-reflectivity material.

For example, the reflective plating layers 217 and 219 may be formed as Ag plating layers or Ag alloy plating layers such as Ag—Al, (hereinafter, referred to as Ag plating layers). The reflective plating layers 217 and 219 may be a non-brilliant plating layer and a high brilliant plating layer, respectively. For example, the non-brilliant plating layer 217 may be formed as a non-brilliant Ag plating layer having relatively rough morphology. In addition, the high brilliant plating layer 219 may be formed as a brilliant Ag plating layer in which a sufficient amount of brightener is mixed with Ag. The non-brilliant plating layer 217 may be formed by high-speed plating whereby a high current density of 5 to 10 ASD is applied. In addition, the high brilliant plating layer 219 may be formed by high-speed plating whereby a predetermined amount of brightener is added to the high brilliant plating layer 219 and a high current, for example, a high current density of 5 to 10 ASD is applied to improve plating speed.

The non-brilliant plating layer 217 is introduced to prevent diffusion roughness from being buried by high brilliant plating micro-morphology and prevent the effect of diffusion roughening from being offset due to formation of a smooth plating surface when the high brilliant plating layer 219 is applied directly to the diffusion-roughened surface. The non-brilliant plating layer 217 has relatively rough morphology, and thus, may maintain diffusion roughness for light diffusion and may be maintained with a predetermined plating thickness.

As illustrated in FIG. 9E, the non-brilliant plating layer 217 may be formed along a surface of the base substrate 210 or the metal coating layer 215 formed on the surface of the base substrate 210 having diffusion roughness. The non-brilliant plating layer 217 may be formed along the concave-convex portion of the surface of the base substrate 210 or the metal coating layer 215 formed on the surface of the base substrate 210 that forms diffusion roughness, and has relatively rough morphology, and thus does not form a smooth surface by encapsulating the concave-convex portion.

A thickness t1 of the non-brilliant plating layer 217 may be plated at an appropriate ratio of a relationship between the non-brilliant plating layer 217 and the high brilliant plating layer 219 for light diffusion, for example, 35 to 50% of an overall thickness of the reflective plating layers 217 and 219. In other words, when the thickness t1 of the non-brilliant plating layer 217 is 35 to 50% of the overall thickness of the reflective plating layers 217 and 219, a wide viewing angle may be obtained, and light diffusion may be promoted.

The high brilliant plating layer 219 forms an outermost surface of a lead frame, and forms a reflective surface on a path on which light is emitted from the light-emitting device 150. Thus, the high brilliant plating layer 219 is formed to a sufficient thickness t2 so that brilliance of the reflective surface may be improved, and the high reflectivity of the high brilliant plating layer 219 may be maintained. For example, the high brilliant platting layer 219 may be formed to about 40 to 60% of the overall thickness of the reflective plating layers 217 and 219.

The reflective plating layer including the non-brilliant plating layer 217 and the high brilliant plating layer 219 has an acicular structured high brilliant surface with diffusion roughness, as illustrated in FIG. 9F. The reflective plating layer has reflectivity (brilliance) in a range of 1.0 to 1.6 GAM as a result of measurement using measurement equipment VAS 300 series. In addition, the reflective plating layers 217 and 219 have white surfaces compared to mirror reflective surfaces of the high brilliant plating layers.

Figure 14:
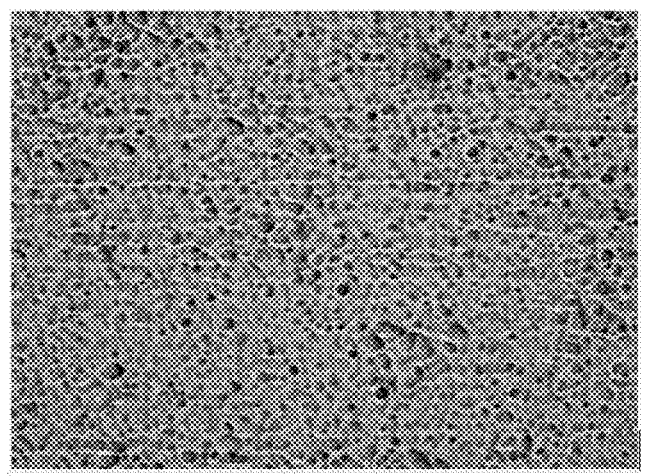
FIG. 14 is a photo showing a state of a surface of a reflective plating layer having diffusion roughness, according to an exemplary embodiment.
Figure 15:
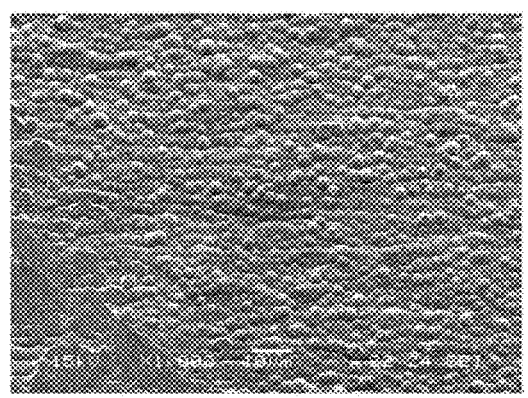
FIG. 15 is a photo showing the state of a surface of a reflective plating layer having diffusion roughness, according to an exemplary embodiment.

FIG. 14 is a photo showing a state of a surface of the reflective plating layer having diffusion roughness, according to an exemplary embodiment, and FIG. 15 is a photo showing a state of a surface of a reflecting plating layer similar to the reflective plating layers 217 and 219 of FIG. 9F, according to an exemplary embodiment. The reflective plating layers 217 and 219 have diffusion roughness along their surfaces and white surfaces.

In a specific exemplary embodiment, the non-brilliant plating layer 217 and the high brilliant plating layer 219 that constitute the reflective plating layers 217 and 219 may be formed to a thickness at a ratio of about 1:1 (t1:t2=1:1). The non-brilliant plating layer 217 and the high brilliant plating layer 219 have a difference in ingredients depending on the use of a brightener and also have a difference in grain size. For example, the brightener may be used in making the grain size of one of the two layers finer than that of the other layer. In this way, the non-brilliant plating layer 217 and the high brilliant plating layer 219 may differ from each other in ingredients and grain size.

The reflective plating layers 217 and 219 may be formed in an entire area of the base substrate 210. Unlike this, for example, the reflective plating layers 217 and 219 may also be formed in an area of the base substrate 210 in a range where light emitted from the light-emitting device 150 reaches, for example, in a range corresponding to an internal area of the lead frame.

By performing the above-mentioned processes, formation of a lead frame according to an exemplary embodiment is completed. Thereafter, a post-plating process may be performed on the lead frame. The post-plating process is performed to prevent tarnish of the reflective plating layers 217 and 219 and to dry the lead frame. For example, the post-plating process may include a series of unit processes, such as an electro cleaning process, an anti-tarnish process, a dry process, and the like.

Figure 16:
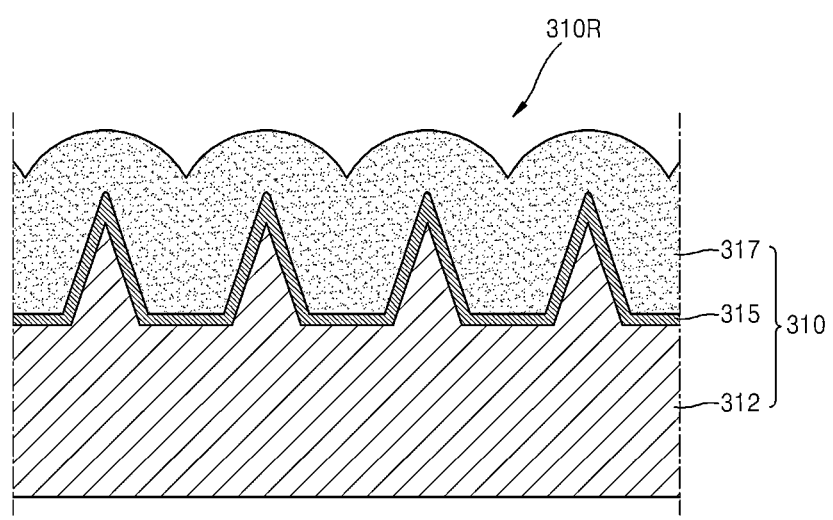
FIG. 16 is a cross-sectional view of a lead frame for a light-emitting device package according to another exemplary embodiment, which enlarges a portion corresponding to the portion II of FIG. 1.

FIG. 16 is a cross-sectional view of a lead frame 310 for a light-emitting device package according to another exemplary embodiment, which enlarges a portion corresponding to the portion II of FIG. 1.

Referring to FIG. 16, the lead frame 310 may have a stack structure in which a base substrate 312, a metal coating layer 315 formed on the base substrate 312 to improve a bonding force between layers formed of different materials, and a reflective plating layer 317 formed on the metal coating layer 315 are sequentially disposed.

A reflective surface 310R, on which light emitted from the light-emitting device 150 is incident, is formed on a top surface of the lead frame 310 and has predetermined surface roughness for light diffusion. The reflective surface 310R having the predetermined surface roughness promotes diffuse reflection or scattering of the light emitted from the light-emitting device 150 so that the light may be diffused with a wide radiation width.

The reflective surface 310R of the lead frame 310 may be implemented as the reflective plating layer 317 that forms an outermost circumference of the lead frame 310. The reflective plating layer 317 may be formed of at least one material, having high reflectivity in a visible light band, which includes Al, Ag, Au, and the like. In addition, the reflective plating layer 317 may be also formed of an alloy material including functional ingredients other than the high-reflectivity material. The reflective surface 310R of the lead frame 310 may be also formed of a high brilliant metal.

Hereinafter, a method of manufacturing a lead frame for a light-emitting device package according to another exemplary embodiment will be described with reference to FIGS. 17A through 17E.

Figure 17A:
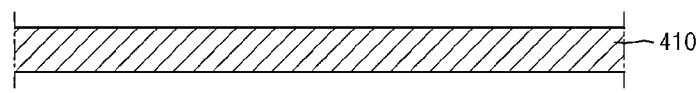
FIGS. 17A through 17E are cross-sectional views illustrating a method of manufacturing a lead frame for a light-emitting device package, according to another exemplary embodiment.

First, as illustrated in FIG. 17A, a base substrate 410 for a lead frame is prepared. The base substrate 410 may be formed of a general lead frame material, such as a Cu thin plate, a Cu alloy thin plate, an alloy thin plate having a main ingredient as iron-Ni, or the like.

Figure 17B:
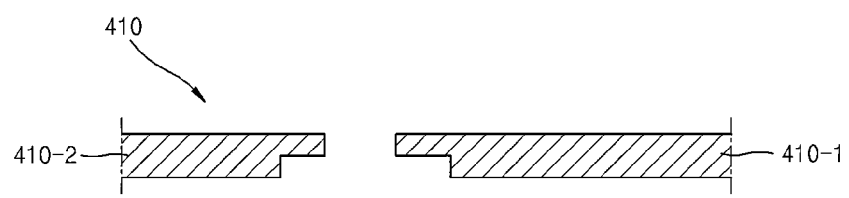

Next, as illustrated in FIG. 17B, a patterning process of forming lead frame patterns on the base substrate 410 is performed. In the patterning process, lead frame patterns having a first lead area 410-1 and a second lead area 410-2 with different polarities may be formed by removing a portion of the base substrate 410, and chemical etching, mechanical stamping, punching formation, or the like may be used in performing the patterning process. For example, the first and second lead areas 410-1 and 410-2 may be asymmetrical with each other, and one of the first and second lead areas 410-1 and 410-2 may be formed larger, and the light-emitting device 150 may be mounted on the lead area 410-1 that is formed larger.

Next, a pre-plating process in which an oxidation layer formed on the surface of the base substrate 410 is removed by surface processing the base substrate 410 and the surface of the base substrate 410 is activated, is performed. This pre-plating process may be performed through a series of unit processes, for example, electro degreasing, first acid dipping, chemical polishing, second acid dipping, neutralization, and the like. According to an exemplary embodiment, the pre-plating process may be performed before the patterning process.

Figure 17C:
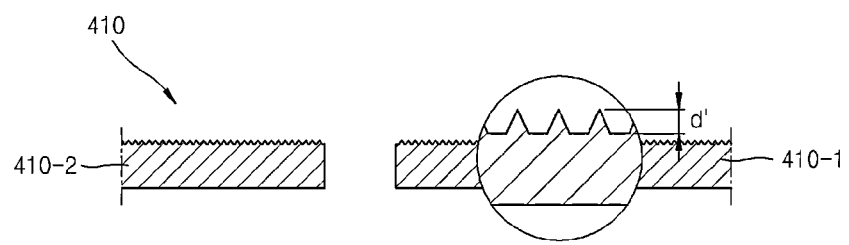

Next, as illustrated in FIG. 17C, a diffusion roughening process in which a surface of the base substrate 410 for light diffusion is diffusion roughened, is performed. For example, in the diffusion roughening process, predetermined surface roughness sufficient to maintain a shape of patterns or a structure of the lead frame is formed. Here, diffusion roughness may refer to surface roughness sufficient to promote light diffusion without changing the patterns or structure of the lead frame. For example, the surface roughness in the diffusion roughening process may refer to an etching depth d' of about 1.0 to 5.0 μm.

More specifically, the diffusion roughening process may be performed by using a chemical process and/or a physical process. The chemical process may include a chemical etching process, for example, micro etching, soft etching and/or flash etching to form a thin etching depth and/or an oxidation process, for example, black oxidation or brown oxidation. The physical process may include a polishing process such as mechanical stamping, sand blasting, or the like. Technical matters that are substantially the same as described with reference to FIG. 9C may be applied to the diffusion roughening process, and redundant descriptions thereof will be omitted.

Figure 17D:
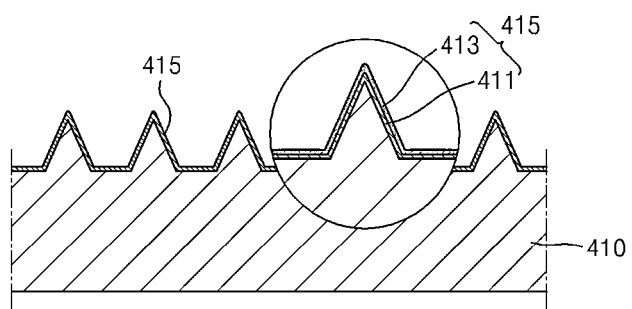

Next, as illustrated in FIG. 17D, a metal coating layer 415 may be formed on the base substrate 410. The metal coating layer 415 may include a metal seed layer 411 and an under layer 413, for example. Technical matters that are substantially the same as described with reference to FIG. 9D may be applied to the metal seed layer 411 and the under layer 413, and redundant descriptions thereof will be omitted.

Figure 17E:
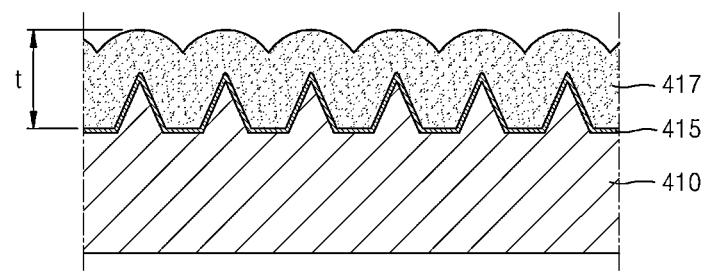

Next, as illustrated in FIG. 17E, a reflective plating layer 417 is formed on the base substrate 410. However, although not shown, an Ag strike layer may be formed in order to improve a bonding force between layers before forming the reflective plating layer 417.

The reflective plating layer 417 serves to improve light extraction efficiency of the light-emitting device 150 by reflecting light emitted from the light-emitting device 150 with high reflectivity (brilliance). The reflective plating layer 417 may be formed of at least one material, having high reflectivity in a visible light band which includes Al, Ag, Au, and the like. In addition, the reflective plating layer 417 may be also formed of an alloy material including functional ingredients other than the high-reflectivity material.

For example, the reflective plating layer 417 may be formed as an Ag plating layer or an Ag alloy plating layer such as Ag—Al, (hereinafter, referred to as an Ag plating layer). The reflective plating layer 417 may be formed as the Ag plating layer, and the Ag plating layer may be formed by mixing a sufficient amount of brightener with Ag. For example, when the reflective plating layer 417 is formed, a plating layer is grown on the surface of a material to be plated immersed in a high brilliant Ag plating bath, for example, the base substrate 410, and plating is performed with a low current density so that the plating layer may be grown while diffusion roughness on the surface of the material to be plated is maintained. For example, when the reflective plating layer 417 is formed, plating may be performed with a low current density of 0.3 to 2.0 ASD when 0.3 ASD is set as a lower limit value and 2.0 ASD is set as an upper limit value. More specifically, when the reflective plating layer 417 is formed, a current density of 1 ASD may be applied. The reflective plating layer 417 formed by applying the low current density does not have acicular-structured morphology but spherical morphology. When the Ag plating layer is generally formed, high-speed plating is performed with a high current density, for example, 5 to 10 ASD, and thus, plating morphology of the Ag plating layer has an acicular structure.

The reflective plating layer 417 is formed in a spherical structure by performing plating at low speed by applying a low current density. As illustrated in FIG. 17E, diffusion roughness formed on the base substrate 410 may be maintained. That is, the plating layer is slowly formed according to the diffusion roughness on the base substrate 410 by performing low-speed plating so that the surface of the reflective plating layer 417 has diffusion roughness.

When high-speed plating is performed on the diffusion-roughened surface by using a high current density, the diffusion roughness may be buried by the plating layer, and a smooth plating surface is formed so that the effect of diffusion roughening is offset. The reflective plating layer 417 has plating morphology in a spherical structure, and is formed by low-speed plating so that diffusion roughness for light diffusion may be maintained.

As illustrated in FIG. 17E, the reflective plating layer 417 may be formed along a surface of the base substrate 410 or the metal coating layer 415 formed on the surface of the base substrate 410 having diffusion roughness. The reflective plating layer 417 may be formed along the concave-convex portion of the surface of the base substrate 410 or the metal coating layer 415 formed on the surface of the base substrate 410 that forms diffusion roughness, and has spherical plating morphology that follows the concave-convex portion.

The reflective plating layer 417 forms an outermost surface of the lead frame and forms a reflective surface on a path on which light is emitted from the light-emitting device 150. Thus, the reflective plating layer 417 needs to be formed to a sufficient thickness t by adding a predetermined amount of brightener to the reflective plating layer 417.

Figure 18A:
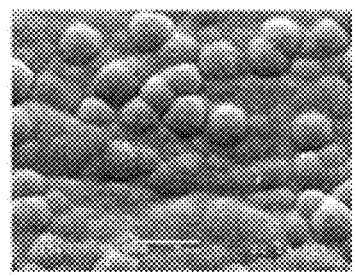
FIGS. 18A through 18C are photos showing a surface of a reflective plating layer enlarged with different magnifications, according to exemplary embodiments.
Figure 18B:
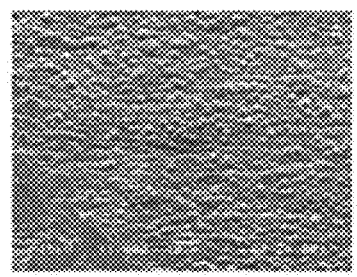
Figure 18C:
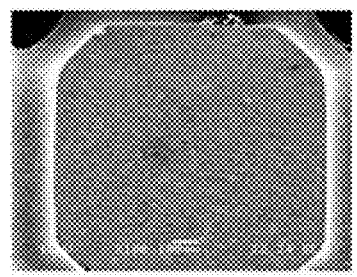

FIGS. 18A through 18C are photos showing the surface of the reflective plating layer 417 illustrated in FIG. 17E, which is enlarged with different magnifications.

Referring to FIGS. 18A through 18C, the reflective plating layer 417 has diffusion roughness and a high brilliant surface with spherical morphology. The reflective plating layer 417 has reflectivity (brilliance) in a range of 0.6 to 1.2 GAM as a result of measurement using measurement equipment VSR 300 series. In addition, the reflective plating layer 417 has a white surface compared to the reflective surface obtained by high-speed plating using a high current density.

Figure 19:
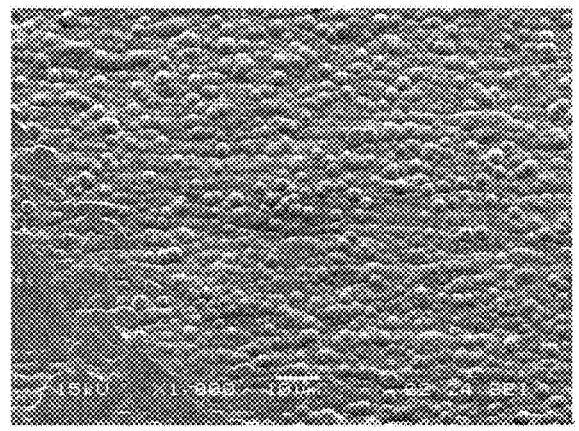
FIG. 19 is a photo showing a state of a surface of a reflective plating layer having diffusion roughness, according to an exemplary embodiment.
Figure 20:
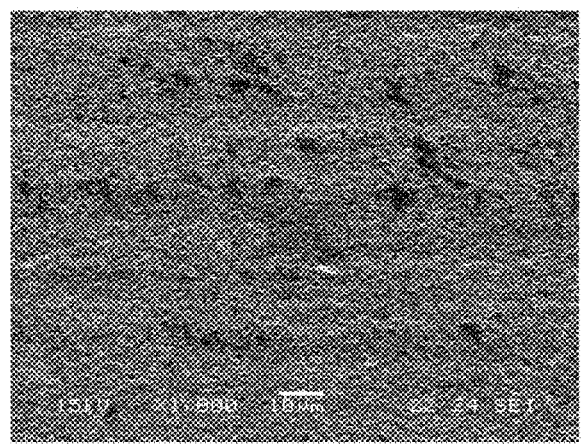
FIG. 20 is a photo showing the state of a surface of a plating layer having a mirror reflective surface, according to a related art.

FIG. 19 is a photo showing a state of a surface of a reflective plating layer having diffusion roughness, according to an exemplary embodiment, and FIG. 20 is a photo showing a state of a surface of a plating layer having a mirror reflective surface, according to a related art. The reflective plating layer illustrated in FIG. 19, which is the same as the reflective plating layer illustrated in FIG. 15, has diffusion roughness along its surface and a white surface; however, the minor reflective surface illustrated in FIG. 20 has a surface that appears black.

When low-speed plating is performed using a low current density, both a reel-to-reel plating process and a batch plating process may be applied. However, in the reel-to-reel plating process, the length of a process line needs to be increased in order to perform low-speed plating from a base material wound in a roll form to a base material proceeding at a predetermined transfer speed, and the batch plating process may be more suitably applied.

The reflective plating layer 417 may be formed in an entire area of the base substrate 410. Unlike this, for example, the reflective plating layer 417 may also be formed in an area of the base substrate 410 in a range where light emitted from the light-emitting device 150 reaches, for example, in a range corresponding to an internal area of the lead frame.

Hereinafter, a method of manufacturing a light-emitting device package by using a lead frame, according to an exemplary embodiment will be described with reference to FIGS. 21A through 21C.

Figure 21A:
FIGS. 21A through 21C are cross-sectional views illustrating a method of manufacturing a light-emitting device package by using a lead frame, according to an exemplary embodiment.

First, as illustrated in FIG. 21A, a lead frame 510 on which a reflective surface 510R is formed, is prepared. Formation of the lead frame 510 is as described above, and redundant descriptions thereof will be omitted.

Figure 21B:
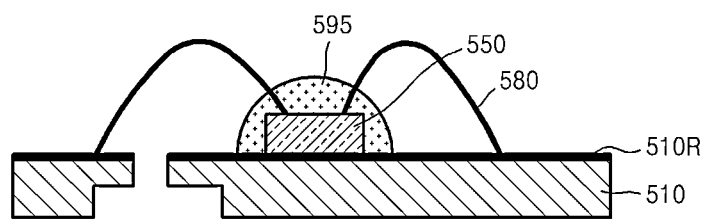

Next, as illustrated in FIG. 21B, a light-emitting device 550 is mounted on a mounting area of the lead frame 510. For example, the light-emitting device 550 may be implemented as a light-emitting diode.

Next, an electrode pad (not shown) of the light-emitting device 550 and the lead frame 510 are electrically connected to each other. For example, one end of a conductive wire 580 is connected to the electrode pad of the light-emitting device 550, and the other end of the conductive wire 580 is connected to the lead frame 510 so that the electrode pad of the light-emitting device 550 and the lead frame 510 may be electrically connected to each other. The conductive wire 580 may be formed in a thin line formed of Au, Cu, or the like. A fluorescent substance 595 is deposited on the lead frame 510 to encapsulate the light-emitting device 550.

Figure 21C:
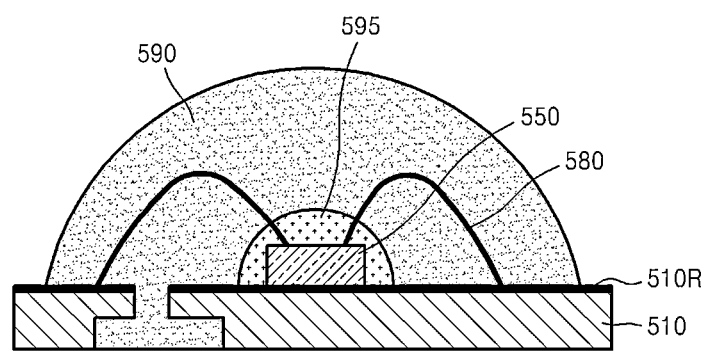

Next, as illustrated in FIG. 21C, a silicon lens 590 is formed on the lead frame 510 on which the light-emitting device 550 is mounted. For example, the silicon lens 590 may be formed to cover the light-emitting device 550 and the conductive wire 580, as illustrated in FIG. 21C. For example, the silicon lens 590 may be formed of a light transparent resin material, and may be formed by applying the light transparent resin material onto the fluorescent substance 595.

For example, the silicon lens 590 may be formed of a silicon resin, an epoxy resin, or the like. As illustrated in FIG. 21C, the silicon lens 590 may have a hemispherical shape.

It will be understood throughout the specification that when another layer is referred to as being "on" one layer, the "on" indicates an upward direction comprehensively, and it refers to both the case where an upper layer can be directly on a lower layer and the case where intervening layers may be present between the lower and upper layers.

For example, when diffusion roughness is formed on the base substrate 210 or 410, it does not refer to only the case where the diffusion roughness is formed directly on the surface of the base substrate 210 or 410. For example, it also refers to the case where a Ni plating layer, a Cu plating layer, or an Ag strike layer formed by a surface roughness plating process is present on the base substrate 210 or 410, i.e., the case where the diffusion roughness is formed on the Ni plating layer, the Cu plating layer, or the Ag strike layer on the base substrate 210 or 410.

For example, when the reflective plating layer 217, 219, or 417 is formed on the diffusion-roughened base substrate 210 or 410, it does not refer to only the case where the reflective plating layer 217, 219, or 417 is formed directly on the surface of the base substrate 210 or 410 having the diffusion roughness. For example, it also refers to the case where a strike layer is present on the base substrate 210 or 410.

According to the exemplary embodiments, a light-emitting device package with a wider viewing angle than a viewing angle of 100 to 120 degrees of a general light-emitting device package may be implemented by surface processing for maximize scattering characteristics of light with respect to a surface of a lead frame. According to an embodiment, diffusion roughness is formed on a surface of a metal layer of a lead frame, and a non-brilliant plating layer and a high brilliant plating layer are formed so that the diffusion roughness may be exposed to a surface of an outermost plating layer of the lead frame. In addition, according to another embodiment, diffusion roughness is formed on a surface of a metal layer of a lead frame, and a reflective plating layer having spherical morphology is formed so that the diffusion roughness may be exposed to a surface of an outermost plating layer of the lead frame.

When a light-emitting device package with a widened viewing angle is used in a backlight unit (BLU) for a display, the number of light-emitting device packages may be remarkably reduced compared to a structure using a general light-emitting device package.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of manufacturing a lead frame, the method comprising:
    preparing a base substrate for the lead frame;
    forming diffusion roughness on the base substrate; and
    forming a reflective plating layer on the diffusion roughness formed base substrate,
    wherein the forming the reflective plating layer comprises forming a reflective plating layer having spherical morphology on the diffusion roughness formed base substrate.

2. The method of claim 1, wherein the forming the diffusion roughness is performed by applying at least one of an etching process, an oxidation process, mechanical stamping, and surface polishing onto the base substrate.

3. The method of claim 2, wherein the etching process comprises applying at least one of a stripper, a hydrogen peroxide-sulfuric acid-based soft etching solution, and an oxidizing agent onto the base substrate.

4. The method of claim 2, wherein the surface polishing process comprises sand blasting.

5. The method of claim 1, wherein the reflective plating layer is formed by applying a low plating current density in a plating process.

6. The method of claim 5, wherein the low current density is set at 0.3 to 2.0 ASD (A/dm$^2$).

7. The method of claim 1, wherein the forming the reflective plating layer comprises forming a plating layer by applying a brightener, and
    wherein the plating layer comprises at least one of silver (Ag), gold (Au) and aluminum (Al).

8. The method of claim 1, further comprising forming a metal coating layer comprising at least one of a metal seed layer and an under layer before the forming the reflective plating layer.

9. A method of manufacturing a lead frame, the method comprising:
    preparing a base substrate for the lead frame;
    forming diffusion roughness on the base substrate; and
    forming a reflective plating layer on the diffusion roughness formed base substrate,
    wherein the forming the reflective plating layer comprises:
        forming a non-brilliant plating layer on the diffusion roughness formed base substrate; and
        forming a high brilliant plating layer, in which more brightener is included than in the non-brilliant plating layer, on the non-brilliant plating layer.

10. The method of claim 9, wherein at least one of the non-brilliant plating layer and the high brilliant plating layer comprises at least one of silver (Ag), gold (Au) and aluminum (Al).

11. The method of claim 9, wherein at least one of the forming the non-brilliant plating layer and the forming the high brilliant plating layer is performed by applying a high current density to a plating layer so that an acicular structure is formed on the plating layer.

12. The method of claim 11, wherein the high current has a current density set at 5.0 to 10 ASD (A/dm$^2$).

13. A method of manufacturing a light-emitting device package, the method comprising:
    preparing a base substrate for the lead frame;
    forming diffusion roughness on the base substrate;
    forming a reflective plating layer on the diffusion roughness formed base substrate;
    installing a light-emitting device;
    connecting the light emitting device to the reflective plating layer;
    depositing a fluorescent substance on the light emitting device;
    encapsulating the light emitting device on which the fluorescent substance is deposited with a lens comprising resin,
    wherein the forming the reflective plating layer comprises forming a reflective plating layer having spherical morphology on the diffusion roughness formed base substrate.

* * * * *